(12) United States Patent
Yang

(10) Patent No.: US 7,955,987 B2
(45) Date of Patent: Jun. 7, 2011

(54) EXPOSURE MASK AND METHOD OF FORMING A CONTACT HOLE OF A SEMICONDUCTOR DEVICE EMPLOYING THE SAME

(75) Inventor: Cheol Hoon Yang, Seoul (KR)

(73) Assignee: Shin & Kim, Seoul (KR)

( * ) Notice: Subject to any disclaimer, the term of this patent is extended or adjusted under 35 U.S.C. 154(b) by 1012 days.

(21) Appl. No.: 11/771,139

(22) Filed: Jun. 29, 2007

(65) Prior Publication Data
US 2008/0280443 A1 Nov. 13, 2008

(30) Foreign Application Priority Data
May 7, 2007 (KR) .................. 10-2007-0044116

(51) Int. Cl.
*H01L 21/302* (2006.01)
(52) U.S. Cl. ........ 438/717; 438/719; 438/725; 438/736; 438/738
(58) Field of Classification Search .................. 438/717, 438/719, 725, 736, 738
See application file for complete search history.

(56) References Cited

U.S. PATENT DOCUMENTS

| 6,114,095 A * | 9/2000 | Nakabayashi et al. ......... 430/311 |
| 6,599,667 B2 * | 7/2003 | Yusa et al. .......................... 430/5 |
| 2003/0180631 A1 * | 9/2003 | Shiota et al. ....................... 430/5 |
| 2004/0018435 A1 * | 1/2004 | Kim .................................. 430/5 |
| 2005/0142463 A1 * | 6/2005 | Mitsui et al. ...................... 430/5 |
| 2008/0054483 A1 * | 3/2008 | Lee et al. ....................... 257/774 |

FOREIGN PATENT DOCUMENTS

KR 1020030000825 A 1/2003

* cited by examiner

*Primary Examiner* — Binh X Tran
(74) *Attorney, Agent, or Firm* — Marshall, Gerstein & Borun LLP

(57) ABSTRACT

An exposure mask and a method of forming a contact hole of a semiconductor device using the same, in which micro patterns can be formed are disclosed herein. In an aspect, an exposure mask method includes a mask substrate, a light-shield pattern formed on the mask substrate, and a transparent pattern in which a plurality of patterns, which are limited to the light-shield pattern and have different short-direction widths and long-direction widths, form a group which is repeatedly arranged. Accordingly, micro photoresist patterns can be formed uniformly.

5 Claims, 4 Drawing Sheets

EXPOSURE MASK AND METHOD OF FORMING A CONTACT HOLE OF A SEMICONDUCTOR DEVICE EMPLOYING THE SAME

CROSS-REFERENCE TO RELATED APPLICATION

The priority of Korean patent application number 10-2007-44116, filed on May 7, 2007, the disclosure of which is incorporated by reference in its entirety, is claimed.

BACKGROUND OF THE INVENTION

The invention relates, in general, to semiconductor devices and, more particularly, to an exposure mask and a method of forming a contact hole of a semiconductor device using the same, in which micro patterns can be formed.

In processes for manufacturing semiconductor devices, a variety of patterns for forming a bit line contact holes, drain contact holes, and so forth are formed by photolithography processes. In such a photolithography process, a photoresist pattern is formed on a wafer by coating a photoresist layer and exposing and developing the photoresist layer employing an exposure mask reticle. Desired patterns are formed by an etch process using the photoresist pattern as a mask. The exposure mask is fabricated by forming a nontransparent chrome pattern on a transparent substrate, such as a quartz substrate. In order to form contact holes having a cross section of the same size and shape, transparent patterns that are opened only in the nontransparent chrome pattern must have the same size and shape.

However, the photoresist pattern formed on the wafer through the photolithography process is greatly distorted compared with a pattern formed in the exposure mask. Distortion is generated by an optical proximity effect in which light passing through the exposure mask pattern generates interference between neighboring patterns in the photolithography process. The optical proximity effect becomes profound when the size of a pattern to be resolved is smaller than that of the wavelength of a light source. Accordingly, there is a problem when the critical dimension of the contact hole pattern formed in the semiconductor substrate is smaller than that of a desired pattern.

FIG. 1 is a scanning electron microscope (SEM) photograph of photoresist patterns of 60 nm in size, which are formed by using an exposure mask having transparent patterns with the same shape and size.

As shown in FIG. 1, even though photoresist patterns having the transparent patterns with the same shape and size have been used, they are distorted and very irregular. The irregular photoresist patterns are further distorted as the size decreases. This problem must be solved in order to fabricate high-integrated semiconductor devices.

SUMMARY OF THE INVENTION

Accordingly, the invention provides an exposure mask and a method wherein uniform and micro photoresist patterns can be formed by performing a photolithography process on a photoresist by using an exposure mask including transparent patterns in which a group, formed by a plurality of patterns having the same cross-sectional area but different widths or lengths, is repeatedly arranged.

One aspect of the invention provides an exposure mask including a mask substrate, a light-shield pattern formed on the mask substrate, and a transparent pattern in which a plurality of patterns, which are limited to the light-shield pattern and have different short-direction widths and long-direction widths, form a group, which is repeatedly arranged. Accordingly, micro photoresist patterns can be formed more uniformly.

In another aspect, the invention, provides a method of forming a contact hole of a semiconductor device, including the steps of forming an etch-stop layer, an insulating layer, a hard mask, and a photoresist over a semiconductor substrate, patterning the photoresist by employing an exposure mask including a transparent pattern in which a plurality of patterns having different short-direction widths and long-direction widths form a group which is repeatedly arranged, patterning the hard mask by employing the photoresist, etching the insulating layer and the etch-stop layer by employing the hard mask, and forming a contact hole through the exposed semiconductor substrate.

DESCRIPTION OF SPECIFIC EMBODIMENTS

Specific embodiments according to the invention are described below with reference to the accompanying drawings.

Figure 1A:
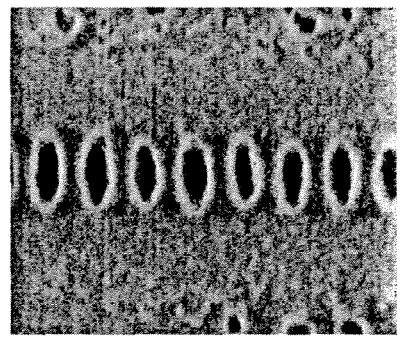
FIG. 1 is a SEM photograph of photoresist patterns of 60 nm in size, which are formed by using an exposure mask having transparent patterns with the same shape and size.
Figure 2A:
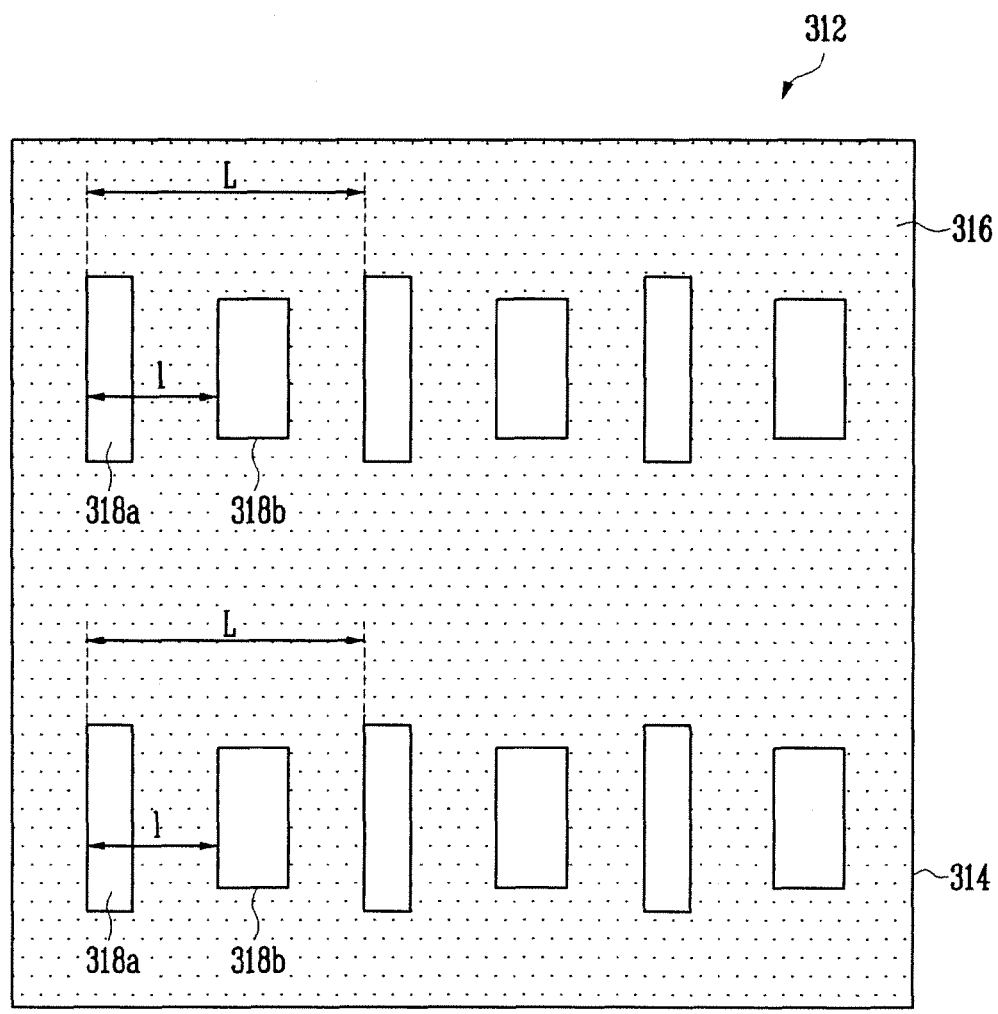
FIG. 2A is a plan view of an exposure mask for illustrating an embodiment of patterns of an exposure mask, which are formed according to an embodiment of the invention.

FIG. 2A is a plan view of an exposure mask for illustrating an embodiment of patterns of an exposure mask, which are formed according to an embodiment of the invention.

Referring to FIG. 2A, an exposure mask 312 can be formed by forming a light-shield pattern 316 made of nontransparent material through which an exposure light source used in a photolithography process cannot transmit, such as chromium, on the surface of a mask substrate 314 made of a transparent material through which an exposure light source cannot transmit, such as SiO$_2$. A plurality of regions where the light-shield pattern 316 is not formed in the mask substrate 314 become a plurality of first transparent patterns 318a and second transparent patterns 318b.

The centers of the first transparent pattern 318a and the second transparent pattern 318b are formed to match to (e.g., coincide with) the centers of regions where drain contact holes are formed in a subsequent process. The first transparent pattern 318a and the second transparent pattern 318b have different widths and lengths. A pair of the first transparent pattern 318a and the second transparent pattern 318b form a group.

Alternatively, the first transparent pattern 318a and the second transparent pattern 318b can have the same width. A short-direction width of the first transparent pattern 318a is preferably 1 to 20% shorter than half the pitch between the first transparent pattern 318a and the second transparent pattern 318b, whereas a short-direction width of the second transparent pattern 318b is preferably 1 to 20% longer than half the pitch between the first transparent pattern 318a and the second transparent pattern 318b. Further, a long-direction width of the first transparent pattern 318a and a long-direction width of the second transparent pattern 318b are preferably are formed such that the first transparent pattern 318a and the second transparent pattern 318b have the same measure of cross-sectional area. Thus, the long-direction width of the first transparent pattern 318a is further longer than that of the second transparent pattern 318b. The short-direction width and the long-direction width of the first transparent pattern 318a constructed above can have a difference of 2 nm or more. Furthermore, the short-direction width and the long-direction width of the second transparent pattern 318b preferably have a difference of 2 nm or more.

The first transparent pattern 318a and the second transparent pattern 318b, forming one group, are preferably spaced apart from an adjacent group by a distance L, which is twice the pitch 1 between the first transparent pattern 318a and the second transparent pattern 318b. A plurality of groups formed by the first transparent pattern 318a and the second transparent pattern 318b are repeatedly arranged to form one row. Furthermore, columns in which the plurality of first transparent patterns 318a and second transparent patterns 318b are alternately formed are arranged on and below the row in which the plurality of first transparent patterns 318a and second transparent patterns 318b are alternately formed, thus forming the transparent pattern of the exposure mask 312.

Figure 2B:
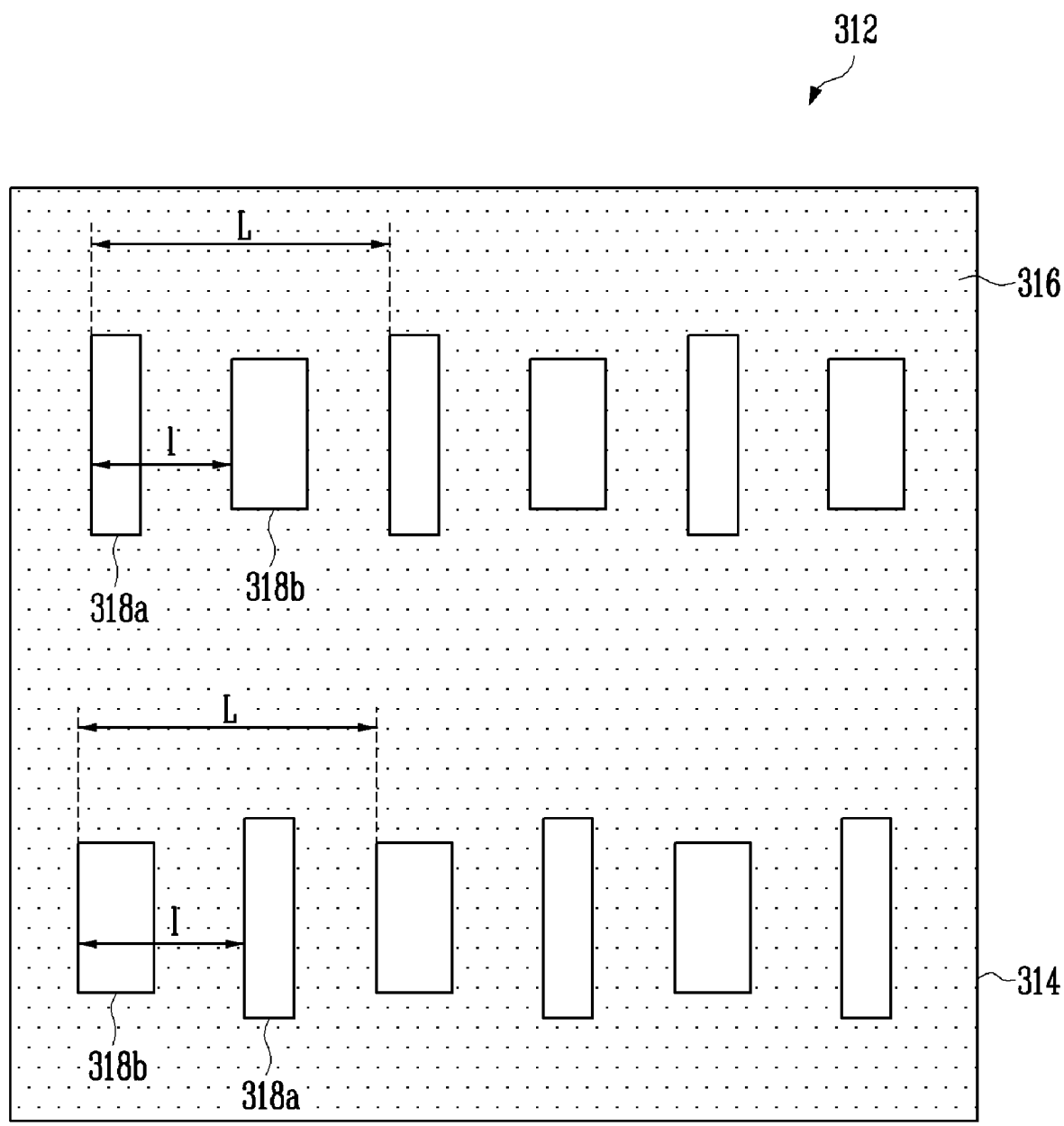
FIG. 2B is a plan view of an exposure mask for illustrating another embodiment of patterns of an exposure mask, which are formed according to an embodiment of the invention.

FIG. 2B is a plan view of an exposure mask for illustrating another embodiment of patterns of an exposure mask, which are formed according to another embodiment of the invention.

Referring to FIG. 2B, in an exposure mask 312, a plurality of regions where a light-shield pattern 316 is not formed in a mask substrate 314 become a plurality of first transparent patterns 318a and second transparent patterns 318b. The first transparent pattern 318a and the second transparent pattern 318b have different widths and lengths. A pair of the first transparent pattern 318a and the second transparent pattern 318b forms a group.

Alternatively, the first transparent pattern 318a and the second transparent pattern 318b can have the same width. A short-direction width of the first transparent pattern 318a is preferably 1 to 20% shorter than half the pitch between the first transparent pattern 318a and the second transparent pattern 318b, whereas a short-direction width of the second transparent pattern 318b is preferably 1 to 20% longer than half the pitch between the first transparent pattern 318a and the second transparent pattern 318b. Further, a long-direction width of the first transparent pattern 318a and a long-direction width of the second transparent pattern 318b are preferably formed such that the first transparent pattern 318a and the second transparent pattern 318b have the same area. Thus, the long-direction width of the first transparent pattern 318a is further longer than that of the second transparent pattern 318b. The short-direction width and the long-direction width of the first transparent pattern 318a constructed above preferably have a difference of 2 nm or more. Furthermore, the short-direction width and the long-direction width of the second transparent pattern 318b preferably have a difference of 2 nm or more.

The first transparent pattern 318a and the second transparent pattern 318b, forming one group, are preferably spaced apart from each other by a distance L, which is twice the pitch 1 between the first transparent pattern 318a and the second transparent pattern 318b. A plurality of groups of first transparent patterns 318a and second transparent patterns 318b are repeatedly arranged to form one row. Furthermore, columns of transparent patterns in each of which one of the first transparent pattern 318a and the second transparent pattern 318b is deviated is arranged in plural numbers on and below the row in which the plurality of first transparent patterns 318a and second transparent patterns 318b are alternately formed, thus forming the transparent pattern of the exposure mask 312.

Although a pair of two transparent patterns with different sizes may form one group, three or more transparent patterns can form one group. In this type of embodiment, the transparent patterns forming one group can have the same cross-sectional area, and a long-direction width and a short-direction width of each of the transparent patterns can have a gradually increasing or decreasing size, for example.

Figure 3:
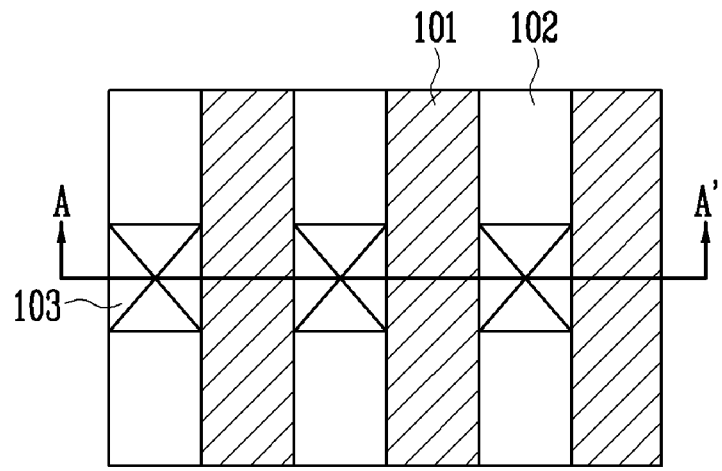
FIG. 3 is a layout diagram for illustrating a method of forming a contact hole of a semiconductor device using the exposure mask according to an embodiment of the invention.

FIG. 3 is a layout diagram for illustrating a method of forming a contact hole of a semiconductor device using the exposure mask according to an embodiment of the invention.

Referring to FIG. 3, a plurality of isolation regions 101 and active regions 102 are alternately formed on a specific region of a semiconductor substrate. In this case, the isolation regions 101 and the active regions 102 are parallel to each other. An isolation layer (not shown) is formed in the isolation region 101, and a structure, such as a junction region (not shown) including a drain/source region and a gate (not shown), is formed in the active region 102.

An insulating layer (not shown) is formed on the structure formed in the active region 102. Part of the insulating layer is etched to form a drain contact hole through which the underlying drain region is exposed. A conductive material is formed in the drain contact hole, forming a drain contact plug 103 so that the bottom is connected to the drain region. A metal line is formed on the drain contact plug 103 to connect the drain region and the metal line.

An embodiment of the foregoing process of forming the drain contact hole 103 is described in more detail below.

Figure 4A:
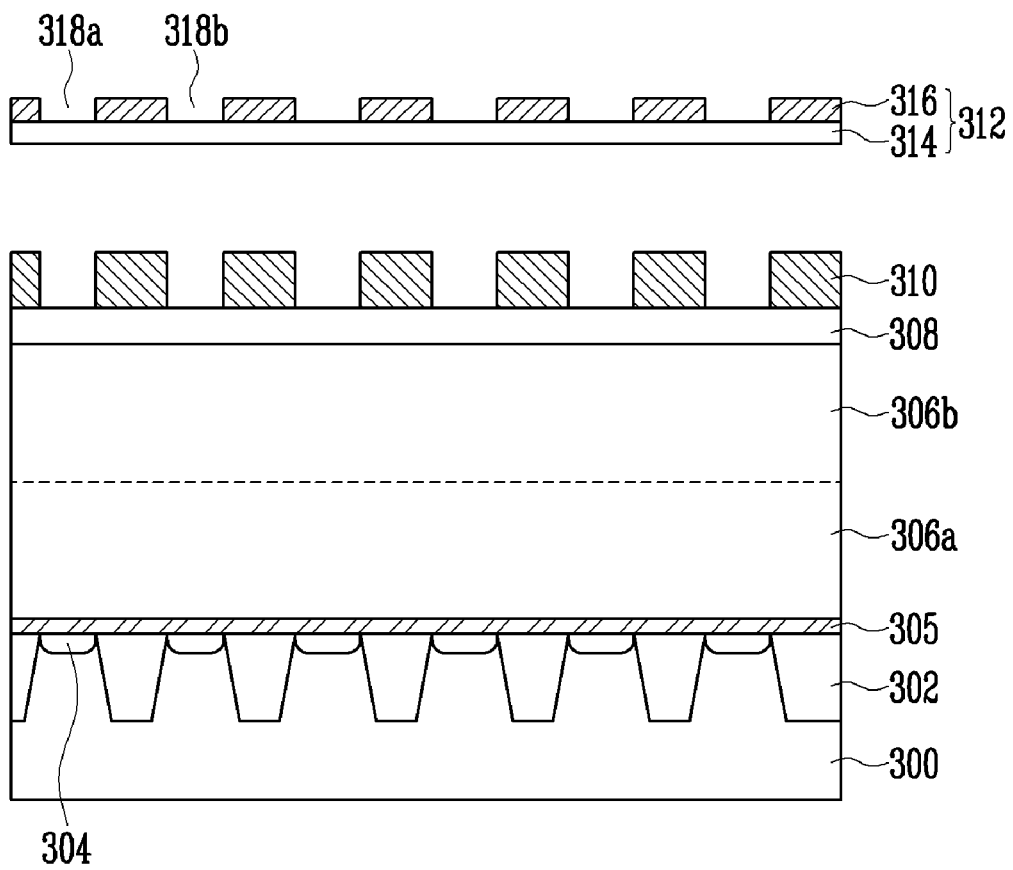
FIGS. 4A and 4B are cross-sectional views illustrating a method of forming a contact hole of a semiconductor device using the exposure mask according to an embodiment of the invention.
Figure 4B:
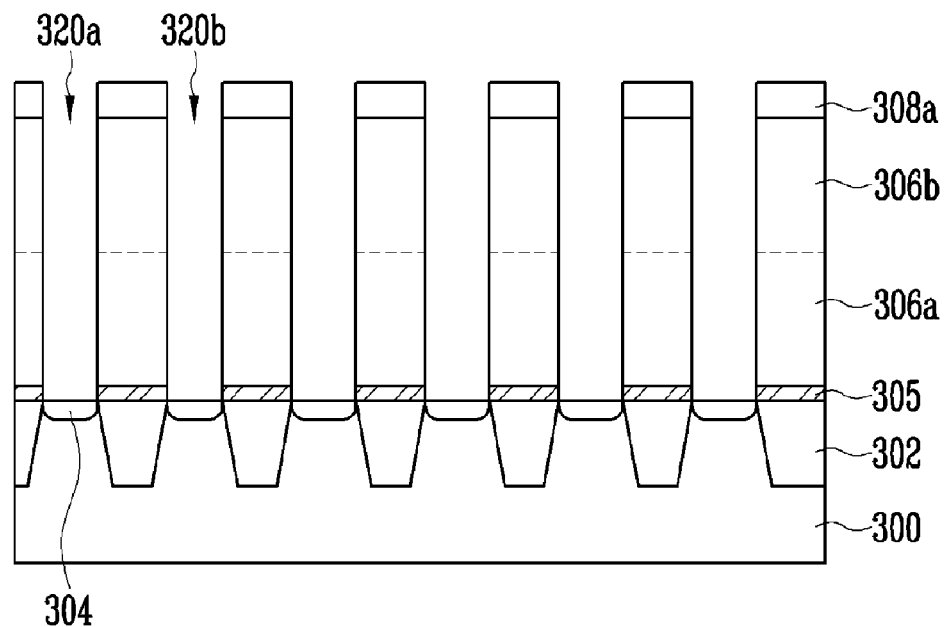
Figure 5:
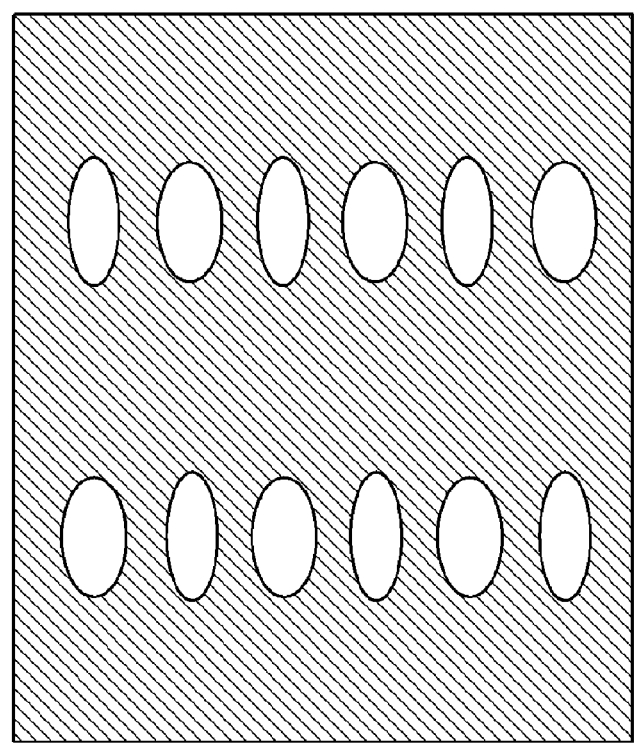
FIG. 5 is a plan view of a photoresist pattern patterned by a photolithography process employing the exposure mask of the invention.

FIGS. 4A and 4B are cross-sectional views illustrating a method of forming a contact hole of a semiconductor device using an exposure mask according to an embodiment of the invention. In particular, FIG. 4 illustrates a cross-sectional view of the semiconductor device taken along line A-A' of FIG. 3. FIG. 5 is a plan view of a photoresist pattern patterned by a photolithography process employing the exposure mask of the invention.

Referring to FIG. 4A, a plurality of isolation layers 302 parallel to each other are formed in specific regions of a semiconductor substrate 300 including a cell region and a peri region, thus defining active regions. The cell region includes a plurality of strings. Each string includes a source select transistor (not shown), a plurality of memory cells (not shown) and a drain select transistor (not shown), which are connected in series. A peri transistor is formed in the peri region.

An ion implantation process is then performed on the entire surface including the transistors and the memory cells, so that a source region (not shown) is formed in the semiconductor substrate 300 at one side of the source select transistor and a drain region 304 in the semiconductor substrate 300 at one side of the drain select transistor. A junction region (not shown) is also formed between the memory cells.

Drain contact holes that are formed with different widths in a subsequent process form a pair, and the pair is repeatedly formed. Thus, the width of the drain region 304 can be preferably formed to correspond to the drain contact holes formed on the drain region 304.

An etch-stop layer 305 and a first insulating layer 306a are formed over the entire surface including the semiconductor substrate 300. The first insulating layer 306a is etched to form the source contact hole (not shown). The first insulating layer 306a can be formed of an oxide layer. After a conductive material is formed in the source contact hole, and a polishing process, such as chemical mechanical polishing (CMP), is performed to form the source contact plug (not shown).

A second insulating layer 306b is formed on the first insulating layer 306a including the source contact plug. A hard mask 308 is formed on the second insulating layer 306b. In this case, an etch-stop layer (not shown) can be further formed below the hard mask 308. A photoresist layer is then formed on the hard mask 308.

Thereafter, the exposure mask 312 formed as described above is disposed over the photoresist layer, which is then patterned by a photolithography process. In this case, the exposure mask 312 can be disposed between an exposure light source and the photoresist layer when the photolithography process is performing in order to selectively expose the surface of the photoresist layer. A development process is then performed on the exposed photoresist layer, forming a photoresist pattern 310.

As shown in FIGS. 4A, 4B, and 5, the transparent patterns 318a and 318b have a square or other rectangular shape, but the photoresist pattern 310 has an oval or circular shape due to interference and diffraction phenomena. Furthermore, the photoresist pattern 310 includes a plurality of pairs of open regions, each having a different short-direction width and long-direction width by means of the transparent patterns 318a and 318b. That is, the open region of the photoresist pattern 310 formed by the first transparent pattern (refer to 318a of FIG. 2B) has a narrow transverse width and a wide longitudinal width, whereas the open region of the photoresist pattern 310 formed by the second transparent pattern (refer to 318b of FIG. 2B) has a wide transverse width and a narrow longitudinal width compared with the open region of the photoresist pattern 310 formed by the first transparent pattern (refer to 318a of FIG. 2B). This is because the first transparent pattern 318a and the second transparent pattern 318b having different transverse widths have effects on each other, such as assist hole effects, and pattern the photoresist. However, since the first transparent pattern (refer to 318a of FIG. 2B) and the second transparent pattern (refer to 318b of FIG. 2B), which form one group, have the same cross-sectional area, the open region of the photoresist pattern 310 forming one group has the same cross-sectional area.

Referring to FIG. 4B, the hard mask 308 is etched by an etch process employing the photoresist pattern (refer to 310 of FIG. 4A), thus forming a hard mask pattern 308a. An open region having a different short-direction width and long-direction width is also formed in each hard mask pattern 308a due to the open region of the photoresist pattern 310 having a different short-direction width and long-direction width. The photoresist pattern 310 is then removed. The second insulating layer 306b, the first insulating layer 306a and part of the etch-stop layer 305 are etched by an etch process employing the hard mask pattern 308a, thus forming drain contact holes 320a and 320b through which the drain region 304 formed in the semiconductor substrate 302 is exposed. In this case, the first drain contact hole 320a having a narrow short-direction width and the second drain contact hole 320b having a wide short-direction width due to the hard mask pattern 308a are consecutively formed while forming one group. However, since the patterns forming one group have the same cross-sectional area in the above patterning process, the entire drain contact holes including the first drain contact hole 320a and the second drain contact hole 320b have the same cross-sectional area.

In the etch process performed to form the first drain contact hole 320a and the second drain contact hole 320b, the etch process is performed on the basis of the first drain contact hole 320a on which the etch process is performed slowly compared with the second drain contact hole 320b due to the narrow short-direction width. At this time, the second drain contact hole 320b can be prevented from being over-etched by forming the etch-stop layer 305 thicker.

Thereafter, though not shown in the drawings, conductive material is formed in the first drain contact hole 320a and the second drain contact hole 320b to form contact plugs electrically connected to the underlying drain region 304. In this case, since the first drain contact hole 320a and the second drain contact hole 320b formed by the above process have the same cross-sectional area, the entire contact plugs are formed to have the same cross-sectional area. Thus, since the contact plugs have different sectional shapes, but have the same contact resistance Rs, semiconductor device characteristics may not be degraded. However, contact plugs forming a part can have different cross-sectional areas to the extent that the operating characteristics of the semiconductor device are not degraded.

Meanwhile, an example in which the drain contact holes are formed has been described above. However, the invention is not limited to the example, but can be applied to all processes of forming contact holes of semiconductor devices, such as bit line contact holes.

As described above, according to the invention, a photolithography process is performed on a photoresist by using an exposure mask including a transparent pattern in which a plurality of patterns having the same cross-sectional areas, but different long-direction widths and short-direction widths form a group and the group is repeatedly arranged. Accordingly, micro photoresist patterns can be formed uniformly.

Although the foregoing description has been made with reference to the specific embodiments, changes and modifications of the invention may be made without departing from the spirit and scope of the invention.

What is claimed is:

1. A method of forming a contact hole of a semiconductor device, comprising the steps of:
    forming an etch-stop layer, an insulating layer, a hard mask, and a photoresist over a semiconductor substrate;
    patterning the photoresist by employing an exposure mask including first groups repeatedly arranged, wherein the respective first group includes transparent patterns having different short-direction widths and long-direction widths;
    patterning the hard mask by employing the patterned photoresist; and
    etching the insulating layer and the etch-stop layer by employing the patterned hard mask, thereby forming second groups repeatedly arranged;
    wherein the respective second groups include contact holes having different short-direction widths and long-direction widths.

2. The method of claim 1, wherein the transparent patterns including the respective first groups have the same cross-sectional area.

3. The method of claim 1, wherein a difference in the long-direction width and the short-direction width of the respective transparent patterns is 2 nm or more.

4. The method of claim 1, wherein the respective first groups comprise a first transparent pattern and a second transparent pattern, and
    a short-direction width of the first transparent pattern is 1 to 20% shorter than half the pitch of the first transparent pattern and the second transparent pattern.

5. The method of claim 1, wherein the etch process of forming the second groups is performed until the semiconductor substrate formed below a contact hole having the narrowest short-direction width is exposed.

* * * * *

UNITED STATES PATENT AND TRADEMARK OFFICE
CERTIFICATE OF CORRECTION

PATENT NO. : 7,955,987 B2
APPLICATION NO. : 11/771139
DATED : June 7, 2011
INVENTOR(S) : Cheol Hoon Yang Page 1 of 1

It is certified that error appears in the above-identified patent and that said Letters Patent is hereby corrected as shown below:

Title Page,

Item (73) Assignee:

The assignee on the first page of the patent should be changed from "Shin & Kim, Seoul (KR)" to --Hynix Semiconductor Inc., Icheon-si (KR)--.

Signed and Sealed this
Twenty-sixth Day of July, 2011

David J. Kappos
*Director of the United States Patent and Trademark Office*